United States Patent [19]
Bowling et al.

[11] Patent Number: 4,718,975
[45] Date of Patent: Jan. 12, 1988

[54] PARTICLE SHIELD

[75] Inventors: Robert A. Bowling, Garland; Graydon B. Larrabee, Dallas, both of Tex.; Benjamin Y. H. Liu, North Oaks, Minn.

[73] Assignee: Texas Instruments Incorporated, Dallas, Tex.

[21] Appl. No.: 915,608

[22] Filed: Oct. 6, 1986

[51] Int. Cl.⁴ .................. H01L 21/306; B44C 1/22; C23C 14/00; B05D 3/06
[52] U.S. Cl. ............................. 156/643; 156/345; 156/646; 118/50.1; 118/620; 118/729; 427/38; 204/192.1; 204/192.32; 204/298
[58] Field of Search .................. 427/38, 39; 118/728, 118/729, 50.1, 620; 156/345, 643, 646, 657, 662; 204/298, 192 EC, 192 E, 192.1, 192.32

[56] References Cited
U.S. PATENT DOCUMENTS
3,984,301 10/1976 Matsuzaki et al. ............ 204/192
4,584,045 4/1986 Richards ........................ 156/345

Primary Examiner—William A. Powell
Attorney, Agent, or Firm—Leo N. Heiting; N. Rhys Merrett; Melvin Sharp

[57] ABSTRACT

A vacuum processing system for processing semiconductor wafers includes a particle shield (16) disposed above the wafer (10) to block moving particles in a vacuum chamber which would otherwise contact the wafer (10). The particle shield (16) is attached to arm (18), allowing the particle shield (16) to be moved away from the wafer or photomask during processing.

19 Claims, 5 Drawing Figures

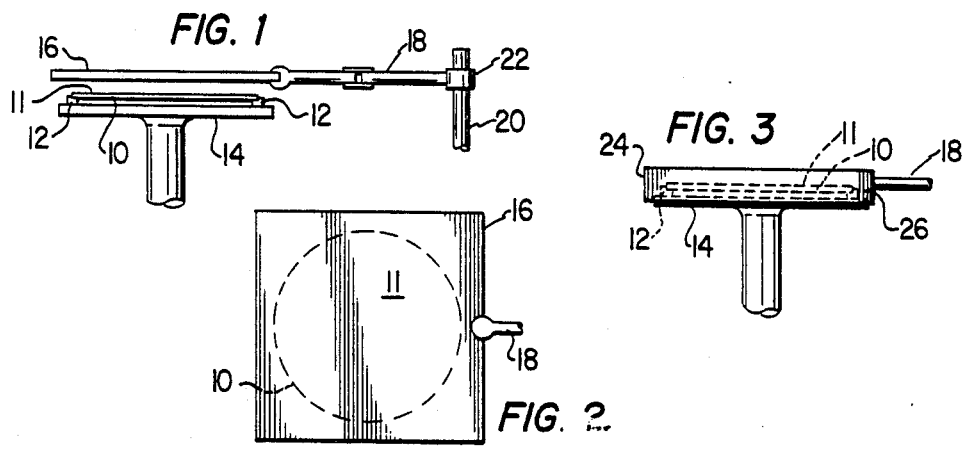
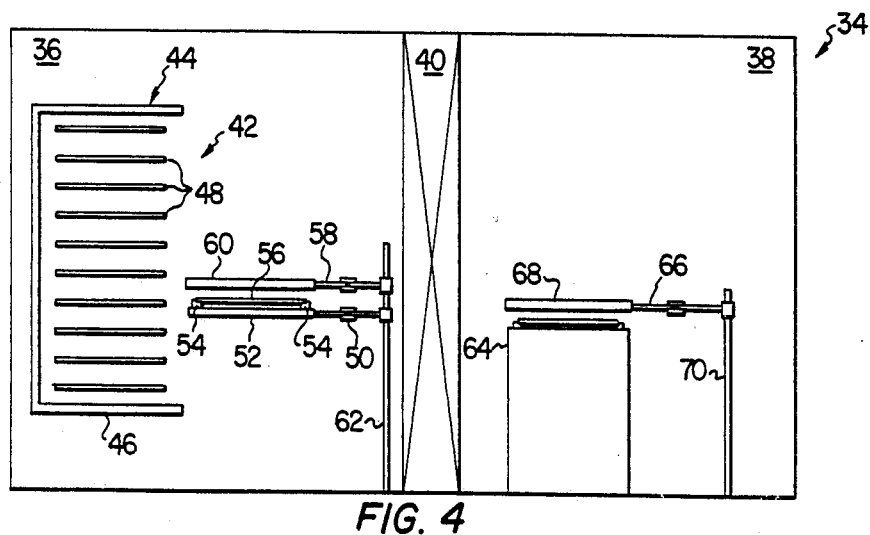
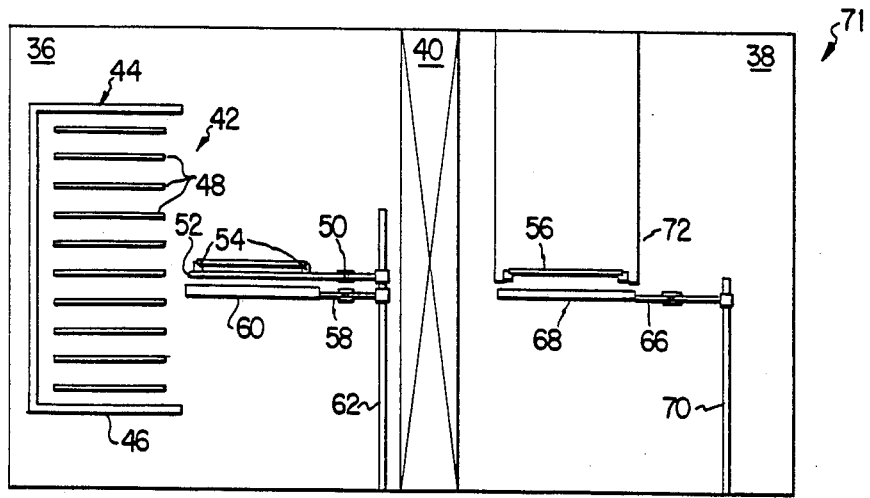

PARTICLE SHIELD

TECHNICAL FIELD OF THE INVENTION

This invention relates in general to integrated circuits, and more particularly, relates to a method and apparatus for protecting semiconductor wafers and photomasks from contamination from small particles during device processing at reduced pressures.

BACKGROUND OF THE INVENTION

In manufacturing integrated circuits, many of the processing steps require vacuum processing, i.e., performing operations on a semiconductor wafer or a photomask within a vacuum chamber. For example, such processing steps as plasma etching, low pressure chemical vapor deposition and ion-implantation are commonly performed in a vacuum. Within the vacuum chamber, however, particles generated by chemical reactions and mechanical abrasions may contact and adhere to the surface of the semiconductor or photomask during processing, resulting in major yield losses.

The movement of such particles within the vacuum chamber can be attributed to two sources. First, the particles may fall on the wafers due to gravity. When gas is present in the vacuum chamber, the particles will be buoyed by the gas and fall very slowly; however, as the gas is removed to create a vacuum, the particles will begin to drop under the force of gravity at an increased speed. The second source of movement is caused by turbulence created by the venting of the vacuum chambers (adding gas to the vacuum chamber to bring the chamber to atmospheric pressure) or by pump-down (removing gas from the chamber to create a vacuum). Particles impelled by turbulence often follow a somewhat circular path within the chamber, as opposed to the essentially downward path of particles falling due to gravity.

Particles are introduced into the vacuum chamber through several mechanisms. Many particles are introduced by mechanical abrasion caused by movement of the equipment in the vacuum chamber, such as robotic arms or gate valves. As the surfaces of the mechanical apparatus rub against each other, particles are released into the chamber. Also, the venting gas may be impure, thus becoming a source of particles. Particles may also be formed as the result of chemical reactions in the chamber. Finally, residual particles may reside in the chamber prior to pump-down and vent.

If a small particle comes in contact with a semiconductor wafer or photomask surface in the vacuum chamber for processing, the particle will often adhere to the surface of the wafer or photomask. The primary forces of adhesion of small (less than 50 micrometer diameter) particles on a dry surface are van der Waals forces. The van der Waals forces of adhesion can increase as a function of time, due to particle and/or surface deformation which increases the contact area. Total forces of adhesion for micron-size particles exceed the gravitational force on that particle by factors greater than $10^6$. For particles with a diameter greater than 50 micrometers, electrostatic forces predominate.

A method of reducing defects due to particle adhesion is to align the surface of the wafer undergoing processing (the "active" surface) in a position other than horizontal and face-up. One such technique aligns the semiconductor wafer or photomask such that its active surface is vertical, i.e., perpendicular to the floor. In this orientation, the surface is less susceptible to particles falling by force of gravity. However, the surface is still in the path of particles moving under the force of turbulence.

Likewise, particle deposition on the wafer or photomask can be reduced by aligning the active surface in a face-down position, i.e. the active surface is positioned towards the floor of the vacuum chamber. In the face-down orientation, particles falling by force of gravity adhere to the back of the wafer or photomask where they are harmless. Once again, however, the active surface is susceptible to particles moving by force of turbulence.

From the foregoing, it may be seen that a need has arisen for a technology which prevents or reduces contact between small particles and a semiconductor wafer or photomask being processed in a vacuum chamber. Furthermore a need has arisen for technology capable of protecting against both falling particles and circulating particles.

SUMMARY OF THE INVENTION

In accordance with the present invention, a particle shielding process and apparatus is provided which substantially eliminates or prevents the disadvantages and problems associated with prior techniques for reducing particle adhesion.

In accordance with another aspect of the invention, an apparatus is provided for preventing adhesion of small particles on a semiconductor wafer or photomask surface during vacuum processing, comprising a shield and structure for positioning the shield within a predetermined distance from the surface to be protected.

In accordance with a further aspect of the invention, a method is provided for preventing the adhesion of small particles on a semiconductor or photomask surface during vacuum processing, wherein a shield is disposed proximate to the surface undergoing processing to protect against particle adhesion during operations involving pump-down of the vacuum chamber, gas introduction to the vacuum chamber, or mechanical motion within the vacuum chamber. The shield is removed away from the surface to be protected during the processing to allow interaction with the surface undergoing processing.

BRIEF DESCRIPTION OF THE DRAWINGS

For a more complete understanding of the present invention and the advantages thereof, reference is now made to the following description now taken in conjunction with the accompanying Drawings in which:

FIG. 1 illustrates a side elevational view of a semiconductor wafer resting face up on supports with a particle shield positioned above the wafer;

FIG. 2 illustrates a top view of a semiconductor wafer being shielded by a particle shield;

FIG. 3 illustrates an alternative embodiment of a particle shield, using a box cover shield;

FIG. 4 illustrates an embodiment of the invention for automatic processing of wafers in a face-up orientation; and FIG. 5 illustrates an embodiment of the invention for automatic processing of wafers in a face-down orientation.

DETAILED DESCRIPTION OF THE INVENTION

The application of the preferred embodiment of the present invention is best understood by referring to FIGS. 1-5 of the Drawings, wherein like numerals are used for like and corresponding parts of the Drawings.

Referring to FIGS. 1 and 2, a wafer 10 formed of silicon or other semiconductor material is illustrated with its active surface 11 (the surface undergoing processing) resting face-up on supports 12 connected to platform 14. Above the wafer 10, a particle shield 16 in accordance with the present invention is positioned close to the active surface 11. The particle shield 16 is connected to arm 18, which is secured to vertical stand 20 by arm collar 22.

In operation, the apparatus shown in FIG. 1 will be placed within a vacuum chamber in order to perform processes on the active surface 11 of wafer 10. Examples of conventional processes which are routinely performed under vacuum conditions are plasma etching, plasma-assisted deposition, and low pressure chemical vapor deposition (LPCVD). As noted, during operations in the vacuum chamber, small particles may be present in the chamber. Collisions between the particles and the wafer 10 result in adhesion of the particle to the wafer surface, which causes defects in the processed wafer, thus reducing yield.

The particle shield 16 is positioned to block those particles which would otherwise come in contact with the active surface 11 of wafer 10. As previously described, particles in the chamber either fall downward due to gravity, or follow a circulating path due to turbulence in the chamber. By positioning the particle shield 16 as closely as possible to the active surface 11, but without contacting the wafer, the active surface 11 is protected from most or all of the moving particles. Experiments have demonstrated that the primary factor in preventing contact between the wafer 10 and the moving particles is the distance between the shield 16 and the active surface 11. For example, reducing the distance between the active surface 11 and the particle shield 16 from ¼ inch to 1/16 inch may significantly reduce the particle count on the active surface 11. However, the desired proximity between the wafer 10 and the particle shield 16 must be balanced with the need to avoid contact between the particle shield 16 and the wafer 10 which would also damage the active surface 11. In practice, a gap of ⅛ inch between the particle shield 16 and the wafer 10 is effective in reducing the particle count, yet allows for sufficient space to avoid contact therebetween.

The particle shield 16 should remain over the active surface 11 of the wafer 10 whenever the wafer 10 is exposed to moving particles in the vacuum chamber. The wafer 10 will be especially vulnerable to particle contact during pump-down and venting of the chamber, or whenever mechanical apparatus, such as robotic arms, are moving. During actual processing, however, it may be necessary to reposition the particle shield 16 to allow interaction with the active surface 11.

The particle shield 16 may be constructed from a variety of materials which are impermeable to foreign particles; the most appropriate material will depend on the application. It is important to choose a material which does not chemically react unfavorably in the vacuum chamber for a given process. A particle shield 16 made of any non-reactive material is suitable for most applications.

The dimensions of the particle shield 16 will depend upon the dimensions of the wafer 10 or the photomask which is being protected. Experiments have shown that a particle shield 16 which extends a quarter of an inch beyond the edge of the wafer 10 is effective in blocking both falling and circulating particles.

The vertical stand 20 and the arm 18 should be constructed so as to hold the particle shield 16 steady throughout the operations. During the various processes which may be performed within the vacuum chamber, gas from within the chamber will be pumped out or vented in, resulting in turbulence within the chamber. Because the particle shield 16 is positioned so closely to the wafer 10, it is important that the vertical stand 20 and arm 18 are constructed to prevent contact between the particle shield 16 and the wafer 10 during operations within the vacuum chamber. Although FIG. 1 illustrates a configuration using an arm 18 and stand 20 for holding the particle shield 16 over the wafer 10, many similar configurations could be substituted.

After a number of operations in the vacuum chamber are completed, the particle shield 16 may need to be cleaned in a suitable solution. This can be performed during the routine maintenance and cleaning of the rest of the process vacuum chamber.

Although FIGS. 1 and 2 display a particle shield 16 positioned over a semiconductor wafer 10, the particle shield 16 may also be used in vacuum chamber processes related to the fabrication of photomasks. For example, in electron-beam patterning of photoresists for etching photomasks, a chromium covered glass plate with a photoresist coating is introduced into a pump-down chamber of a two-chamber vacuum system. The introduction chamber is pumped-down to approximately $10^{-4}$ to $10^{-6}$ torr, while the chromium covered glass plate is protected by the particle shield. After pump-down, the chromium covered glass plate is moved into the main chamber, which is at below $10^{-6}$ torr, where an electron beam patterns the photoresist. A particle shield could be used in this case to prevent particles from adhering to the photomask surface during pump-down and movement between chambers.

FIG. 3 illustrates an alternative embodiment of the invention, using a box cover or side-guarded shield 24. The sides of the shield, one of which is shown as 26, add further protection from particles which might otherwise penetrate the region between the shield and wafer. Thus, the box cover shield 24 adds additional protection against particles moved by turbulence.

Referring now to FIG. 4, there is illustrated an automatic system in accordance with the invention in a vacuum chamber for processing semiconductor wafers in a face-up configuration. The vacuum chamber 34 is formed conventionally and is divided into two sub-chambers, a pump-down chamber 36 and a processing chamber 38. The two chambers are separated by a gate valve 40 which seals the two chambers, 36 and 38, when in a "closed" position, and allows a wafer to pass between the chambers when in an "open" position. The pump-down chamber 36 includes at least one wafer cassette 42 having closed ends 44 and 46. The cassette 42 typically holds about 25 wafers, generally indicated by reference number 48. A robotic wafer transport arm 50 having a transport platform 52 and mounts 54 is operable to slide in between wafers 48 in the cassette 42 in order to remove or replace a wafer currently undergoing processing 56 (hereinafter "the current wafer"). A first robotic shield arm 58 having a first shield 60 may be operated either independently or in tandem with the robotic wafer transport arm 50. In the preferred embodiment, the cassette 42 can move up or down through the use of a standard motor-driver linkage, to allow the removal of a particular wafer 48; alternatively the robotic arms could be designed to move up and down under the control of a servomotor drive to select to proper wafer 48 from a stationary cassette 42. It is understood that the particular apparatus used to move the cassette 42 or robotic arms do not form an essential portion of the present invention and will not thus be described in detail. Both the robotic wafer transport arm 50 and the first robotic shield arm 58 are connected to a first vertical pole 62, about which they may rotate. The robotic wafer transport arm 50 operates to move the current wafer 56 through the gate valve 40, in an "open" position, and place the current wafer 56 on a processing platform 64. A second robotic shield arm 66 connected to a second shield 68 operates to either cover or expose the current wafer 56 while on the platform 64. The second robotic arm 68 is rotatable about a second vertical pole 70.

In operation, the automatic system works as follows. A cassette 42 of unprocessed wafers 48 is placed in the pump-down chamber 36. It should be noted that the cassette 42 has closed ends 44 and 46 which act as shields to protect the wafers during pump-down. After the cassette 42 is placed in the pump-down chamber 36, and the pump-down chamber 36 is sealed shut, the pump-down chamber 36 will be evacuated to produce a vacuum in that chamber. The reaction chamber 38 will be maintained at vacuum process pressures. The unprocessed wafers are protected from falling particles by the cassette 42, particularly the closed ends 44 and 46.

The cassette 42 is lowered or raised under the control of the operator or computer controller into a position in which the current wafer 56 can be loaded between the transport platform 52 and the first shield 60. The robotic wafer transport arm 50 and the first robotic shield arm 58 operate in tandem to sandwich the current wafer 56. The cassette 42 is lowered slightly to allow the mounts 54 to lift the current wafer 56. The robotic arms 50 and 58 again move in tandem, with the transport platform 52 supporting the current wafer 56, and the first shield 60 continuously positioned over the current wafer 56 in order to protect the current wafer 56 from moving particles in the pump-down chamber 36.

The robotic arms 58 and 50 rotate around the first vertical pole 62 toward the gate valve 40. The gate valve 40 opens to allow passage of the platform 52, the current wafer 56, and the shield 60 therethrough. Were the shield 60 not positioned above the current wafer 56, particles released into the chambers by the movement of the robotic arms 50 and 58 and the gate valve 40 could contact the current wafer 56, causing contamination of its surface. The robotic arms, 58 and 50, extend to the processing platform 64 upon which the current wafer 56 is laid, with the first shield 60 positioned above the current wafer 56. After depositing the current wafer 56 on the processing platform 64, the first robotic shield arm 58 and robotic transport arm 50 rotate away from the current wafer 56 to allow the second robotic shield arm 66 to move the second shield 68 to a position above the current wafer 56. Subsequently, the robotic arm 50 and 58 retract from the process chamber 38 and return to the pump-down chamber 36. The gate valve 40 is closed after retraction of the robotic arms 50 and 58.

At this point, processing begins in the processing chamber 38. Just before processing starts, the second shield 68 is repositioned away from the current wafer 56 in order to prevent interference with the process. However, it is important to leave the second shield in place as long as possible, in order to prevent particles from contacting the surface of the current wafer 56. It is important to note that the movement of the gate valve 40, and of the robotic arms 50, 58 and 66, will all introduce particles into the processing chamber, from which the current wafer 56 must be protected.

The second shield 68 should be repositioned over the current wafer 56 after processing has finished. Once processing is over, the gases in the processing chamber 38 will be removed by pumping. When the evacuation is complete, the gate valve 40 opens and the robotic arms 50 and 58 move into a position to pick up the processed wafer 56. The processed wafer 56 is transported back into the processing chamber through gate valve 40 and replaced in the cassette 42. During the transport of the current wafer 56 from the processing platform 64 to the cassette 42, the first shield 60 remains above the current wafer 56 to protect it from moving particles. After replacing the processed wafer 56 in the cassette 42, the robotic arms are removed from the cassette 42 and the cassette 42 is either lowered or raised in order to position the next unprocessed wafer 48 for engagement with the robotic wafer transport arm 50 and transport platform 52. The processing cycle is repeated for each wafer in the cassette.

After all the wafers 48 in the cassette 42 have been processed, the pump-down chamber is "vented"; i.e., a gas is introduced into the chamber to bring the pressure back to atmospheric pressure. Although the vent gas used may be air, nitrogen is most often used for venting, because of its higher purity. Once atmospheric pressure is obtained, the cassette 42 holding the processed wafers may be removed and a new cassette containing unprocessed wafers may be positioned in the pump-down chamber for processing.

During venting, the wafers are protected by the cassette 42 from particles set in motion by the venting gas, either by the turbulence created by the venting process, or as a consequence of an impure venting gas. Aside from protection afforded by the cassette 42, the turbulent effect of the venting gas can be mitigated by reducing the rate of flow of the venting gas into the pump-down chamber 36.

In FIG. 5, a vacuum chamber for automatically processing wafers in a face-down configuration is illustrated. In this embodiment, like numbers have been used to reference elements which are implemented in substantially the same way as in FIG. 4 for face-up processing of the wafer. The system 71 has two chambers, a pump-down chamber 36 and a reaction chamber 38. The pump-down chamber 36 includes a wafer cassette 42 with closed ends 44 and 46 containing a number of unprocessed wafers 48. A robotic wafer transport arm 50 having a transport platform 52 with mounts 54, and a first robotic shield arm 58 having a first shield 60 are connected to a vertical pole 62. Unlike the face-up embodiment of the automatic processing vacuum chamber, this embodiment reverses the relative vertical positions of the first shield 60 and the transport platform 52, such that the shield protects wafers from particles moving upwardly from underneath. A gate valve 40 separates the pump-down chamber 36 from the processing chamber 38, as previously described. Within the processing chamber 38, a suspended platform 72 (shown with wafer 56 in position for processing) is employed to hold the wafers being processed such that processing can occur on the face-down side of the wafer. The second robotic shield arm 66 with a second shield 68 is positioned below the suspended platform 72, in order to protect the wafer from particles moving toward the face-down surface before processing begins. The second robotic shield arm is rotatable around a second vertical pole 70.

In operation, the automatic system for face-down wafer processing works identically to the automatic system for face-up wafer processing, with the exception that the shields, 60 and 68, protect the wafer from underneath at all times prior and subsequent to the processing in the processing chamber 38.

While embodiments have been shown for automatic processing of wafers in both the face-down and face-up positions, it would be possible to implement an automatic system from processing wafers in other configurations, such as vertical wafer processing, using techniques known to those skilled in the art. Regardless of the configuration implemented, the shields should be positioned beside the active surface of the wafer, in order to protect that surface from contact with moving particles within the chambers 36 and 38.

Also, as noted previously, the system can be implemented to process photomasks as well as wafers in substantially the same fashion. By using techniques known to those skilled in the art, the automatic processing systems disclosed above could be adapted for use with photomask processing.

Experimentation with the particle shields has confirmed that use of a particle shield in the vacuum chamber will result in substantial reduction of particle counts on the protected wafers. TABLE 1 shows the effect of using a shield to protect the wafers in face-up and face-down configurations. In both cases shown in TABLE 1, the use of shields to protect the wafers resulted in substantial reductions in the particle counts after processing.

TABLE 1

Comparison of Particle Deposition on 100 mm Silicon Wafers Processed With and Without Particle Shields

| Wafer Configuration | Number of 0.2 to 2 Micron Particles Adhered to Wafer Surface After Processing | |
|---|---|---|
| | With Shield | Without Shield |
| Face-up (Fast pumping & venting) | 32 | 163 |
| Face-down (Fast pumping & venting) | 3 | 14 |
| Face-up (slow pumping & venting) | 17 | 43 |
| Face-down (slow pumping & venting) | 6 | 9 |

TABLE 2 illustrates the effect of varying the distance between the shield and the wafer, and of the use of box covers shields. In this experiment, a large number of 0.5 micron polystyrene latex spheres were intentionally added to the system. It is clear from the findings illustrated in TABLE 2 that the effectiveness of a shield improves dramatically with increased proximity to the wafer. The findings in TABLES 1 and 2 also illustrate that a flat shield located more closely to the wafer offers more protection than a box cover shield surrounding the edges of the wafer.

TABLE 2

Comparison of Particle Deposition on 100 mm Silicon Wafers Processed Using Different Shield Configurations

| Shield Configuration | Number of 0.2 to 2 micron Particles Adhered to to Surface After Processing |
|---|---|
| Unshielded | 6802 |
| Flat shield displaced ¼ inch above wafer | 1308 |
| Flat shield displaced 1/16 inch above wafer | 504 |
| Side-guarded shield, displaced ⅛ inch above wafer | 835 |

It should be noted that the disclosed embodiments of the particle shield can be easily designed to accommodate currently existing vacuum processing equipment. The embodiments can also be designed to work with face-up, face-down, and verticle wafer processing configurations.

The present invention provides advantages as discussed above, as well as numerous other advantages. As will be apparent to those skilled in the art, the present invention can be widely modified and varied. The scope of the invention is not limited, except as set forth in the accompanying claims.

TECHNICAL ADVANTAGES

It is an important technical advantage of the invention that contamination of the surface of a semiconductor wafer or a photomask during vacuum processing may be significantly reduced through the use of a particle shield placed closely to the surface.

It is a further technical advantage that the invention can be adapted for use in presently available vacuum processing equipment.

It is another technical advantage that the invention can be adapted to automated processing of wafers or photomasks in a vacuum processing system.

It is yet another technical advantage that the invention reduces contamination of a surface caused by either falling or circulating particles.

It is yet a further technical advantage that the invention can be used to process wafers in either a face-up, face-down, or vertical configuration.

It is yet a further technical advantage that the invention may be used to protect a wafer or photomask during pump-down of the vacuum chamber, during movement of the wafer or photomask and during venting of the chamber, when the risk of contamination of the wafer or photomask is the greatest.

What is claimed is:

1. Apparatus for preventing adhesion of foreign particles to a surface during vacuum chamber processing, comprising:
    a shield for blocking the particles; and
    positioning means connected to said shield for maintaining said shield a predetermined distance from the surface in order to prevent contact of particles with the surface.

2. The apparatus of claim 1, wherein said shield comprises a substantially flat plate which is impervious to the foreign particles.

3. The apparatus of claim 1 wherein said shield is dimensioned to extend beyond the perimeter of the surface.

4. The apparatus of claim 1 wherein said shield is formed from aluminum or stainless steel.

5. The apparatus of claim 1 wherein said shield is formed from quartz.

6. The apparatus of claim 1, wherein the surfaces of said shield are polished to a mirror finish.

7. The apparatus of claim 6, wherein said shield has a polished finish of about one micron rms.

8. The apparatus of claim 1, wherein said shield further comprises at least one side guard disposed about the edge of said shield to further protect the surface from contact with the particles.

9. The apparatus of claim 1, further comprising adjusting means for enabling movement of said positioning means such that said shield may be temporarily moved away from the surface during processing and returned to its position beside the surface during other times.

10. Apparatus for preventing adhesion of small, moving particles to the surface of a semiconductor wafer or photomask during vacuum chamber processing, comprising:
a shield impervious to the particles;
a robotic arm connected to said shield for positioning said shield at a location closely adjacent but not touching the surface;
control means for controlling movement of said robotic arm; and
a platform for holding the wafer or photomask at a desired position.

11. The apparatus of claim 10, wherein said robotic arm comprises a first robotic arm means, and said control means comprises a first control means, and further comprising:
a second robotic arm for positioning said platform means; and
second control means for controlling the position of said second arm.

12. A system for vacuum processing wherein foreign particles are shielded from the surface being processed, comprising:
a vacuum chamber in which a low pressure may be created for processing of the surface;
a cassette for holding a plurality of devices having surfaces to be processed;
a platform for receiving and positioning the devices;
a shield for shielding a surface of the device on said platform;
a shield arm for positioning said shield closely adjacent the surface to prevent contact of foreign particles with the surface; and
a shield arm controller for controlling the movement of said shield arm.

13. The processing system of the claim 12, wherein said vacuum chamber comprises a first vacuum chamber and further comprising a second vacuum chamber separated from said first vacuum chamber by a valve.

14. The processing system of claim 13, wherein said shield comprises a first shield and further comprising:
a second shield for being disposed adjacent a surface in said second chamber; and
positioning means for positioning said second shield in said second chamber.

15. The processing system of claim 12, wherein said cassette has closed ends to protect the devices from moving particles within said first chamber.

16. The processing system of claim 12, further comprising platform arm means for positioning said platform means.

17. A method of preventing adhesion of small foreign particles on the surface of a device during vacuum processing comprising the steps of:
positioning the device at a predetermined position during the vacuum processing; and
positioning a particle impervious shield adjacent to the surface undergoing processing, said shield being a fixed distance from and positioned sufficiently close to the surface to prevent contact by the particles to the surface.

18. A method for processing semiconductor wafers, comprising the steps of:
supporting a plurality of semiconductor wafers in a wafer cassette located in a first vacuum chamber;
reducing the pressure in said first vacuum chamber to a low pressure;
reducing the pressure in a second vacuum chamber to a low pressure;
removing a wafer from said cassette and positioning said wafer in a desired position for processing;
positioning a particle shield closely adjacent the surface of said wafer undergoing processing, such that small, moving foreign particles within said first chamber are prevented from contacting said surface;
moving said wafer and said shield from said first chamber to said second chamber; and
processing said wafer.

19. The method of claim 18, further comprising the steps of:
moving said shield away from said wafer before processing said wafer; and
repositioning said shield beside the processed surface of said wafer before returning said wafer to said cassette.

* * * * *